United States Patent [19]

Chen

[11] Patent Number: 4,547,686

[45] Date of Patent: Oct. 15, 1985

[54] HYBRID POWER SEMICONDUCTOR SWITCH

[75] Inventor: Dan Y. Chen, Blacksburg, Va.

[73] Assignee: The United States of America as represented by the Administrator of the National Aeronautics and Space Administration, Washington, D.C.

[21] Appl. No.: 537,614

[22] Filed: Sep. 30, 1983

[51] Int. Cl.⁴ .................. H03K 17/08; H03K 17/10
[52] U.S. Cl. .................... 307/570; 307/264; 307/270; 307/566; 307/572
[58] Field of Search ....... 307/200 A, 200 B, 564–566, 307/246, 577, 570–572, 584, 270, 254, 264, 318, 300; 323/271

[56] References Cited

U.S. PATENT DOCUMENTS

| | | | |
|---|---|---|---|
| 3,631,528 | 12/1971 | Green | 307/570 |
| 3,963,946 | 6/1976 | Zajac | 307/270 |
| 4,303,841 | 12/1981 | Baker | 307/570 |
| 4,356,416 | 10/1982 | Weischedel | 307/270 X |
| 4,360,744 | 11/1982 | Taylor | 307/270 X |
| 4,480,201 | 10/1984 | Jaeschke | 307/570 |

FOREIGN PATENT DOCUMENTS 2080651 2/1982 United Kingdom ............... 307/570

Primary Examiner—Stanley D. Miller
Assistant Examiner—D. R. Hudspeth
Attorney, Agent, or Firm—James A. Mackin; John R. Manning; Gene F. Shook

[57] ABSTRACT

The voltage rating of a bipolar transistor may be greatly extended while at the same time reducing its switching time by operating it in conjunction with FETs in a hybrid circuit. One FET is used to drive the bipolar transistor while the other FET is connected in series with the transistor and an inductive load. Both FETs are turned on or off by a single drive signal of load power, the second FET upon ceasing conduction, rendering one power electrode of the bipolar transistor open. Means provided to dissipate currents which flow after the bipolar transistor is rendered nonconducting.

11 Claims, 4 Drawing Figures

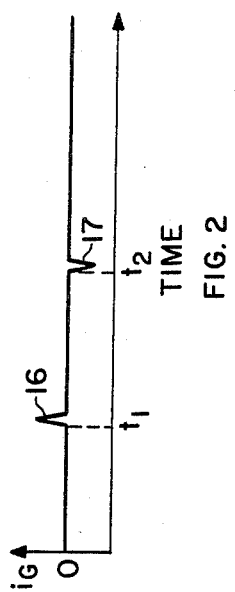
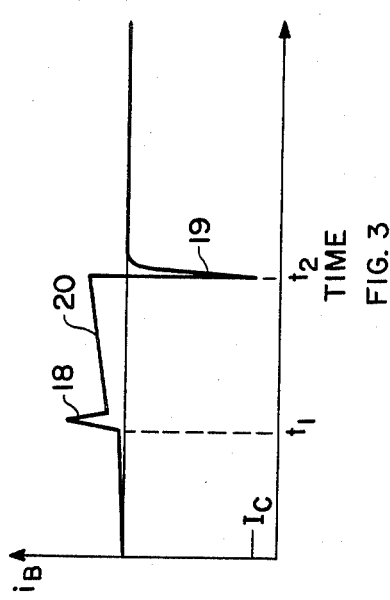
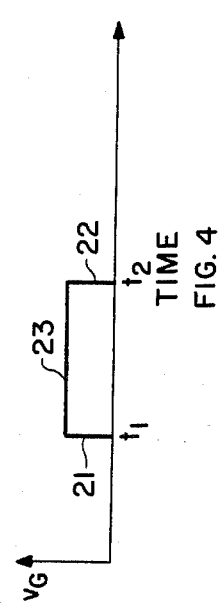
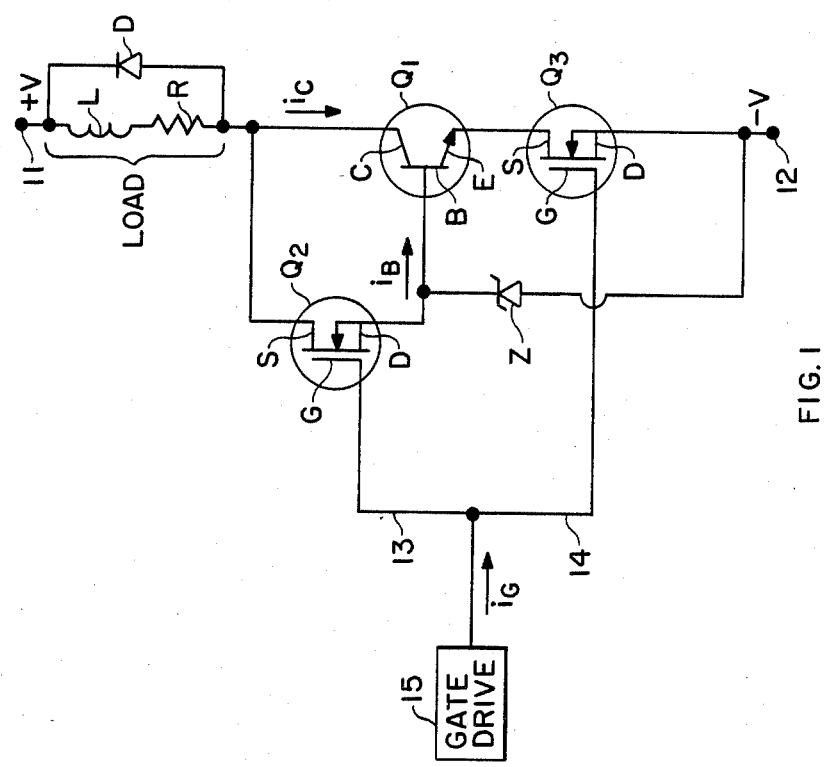

HYBRID POWER SEMICONDUCTOR SWITCH

ORIGIN OF THE INVENTION

The invention was made by a non-Government employee who has assigned all rights in the invention to the Government.

TECHNICAL FIELD

The invention relates to switches for controlling the current required by inductive loads and is directed more particularly to semiconductor switches for inductive loads.

When bipolar transistor switches are used with inductive loads, sudden turn-off of the transistor by applying reverse bias to its base electrode causes reverse bias second breakdown. Accordingly, bipolar transistors used to switch inductive loads must be rated approximately 50%, that is, the collector-emitter voltage must be no greater than 50% of the maximum allowable collector-base voltage. It is desirable to extend the voltage rating of a bipolar transistor used as a switch as well as decreasing time required for it to turn off and turn on. Alternatively, the width of the bipolar transistor collector may be reduced.

BACKGROUND ART

Some prior art circuits have extended the operating range of a bipolar switching transistor by connecting a second bipolar transistor in series with the collector-emitter current path of the switching transistor. While the second transistor can turn off to provide emitter open operation of the switching transistor, thereby extending its voltage rating, the switching times of bipolar transistors are relatively long. Circuits have also been devised to decrease the switching time of bipolar transistors. This has been accomplished by using field effect transistors (FETs) to provide drive current for the switching transistors. Of course, the voltage rating of the bipolar transistor is not extended with such an arrangement.

Prior art reference patents are as follows:

U.S. Pat. No. 3,716,723 to Heuner et al discloses two current carrying paths, each including a FET in series with a diode. The diodes are pulled to permit a node to be charged when one transistor is turned on and discharged when the other transistor is turned on.

U.S. Pat. No. 4,042,836 to Compton et al discloses circuitry in which a FET acts as an off-on type switch and is controlled by a driver voltage applied to its gate electrode. The driver circuit includes means for rapidly switching the FET while drawing relatively low current in the off and on states.

U.S. Pat. No. 3,970,869 to Coats, Jr. discloses a computer switching circuit including a FET and a diode connected between a pair of transistors. The second transistor is the switching device and is controlled by FET which, in turn, receives a signal from the first transistor.

U.S. Pat. No. 4,296,336 to Skanadore discloses a bipolar switching transistor which is controlled by a second bipolar transistor. The patent teaches that the geometry of the transistor is such that the maximum distance between the base contact region and any point of the emitter is sufficiently small to prevent the degree of constriction of emitter current which will cause the critical electrical field of the collector region to be exceeded.

DISCLOSURE OF THE INVENTION

In accordance with the present invention, an inductive load, the power electrodes of a bipolar transistor and the power electrodes of a FET are serially connected in the order named between a positive voltage and a negative voltage. The power electrodes of a second FET are connected between the load and the control electrode of the bipolar transistor. Each of the FETs has a gate electrode and both of these electrodes are connected to a source of electrical switching control signals.

Both FETs turn on when positive voltage is applied to their gates. The second FET provides turn-on current to the bipolar transistor rendering it conducting.

When the positive voltage is removed from the respective gates of the FETs they turn off, the first FET establishing an open condition at the power electrode of the bipolar transistor connected to the first FET. A breakdown voltage device connected between negative supply voltage and the control electrode of the bipolar transistor discharges various capacitances of components and bypasses current around the first FET.

BRIEF DESCRIPTION OF THE DRAWINGS

The invention will be described with a respect to drawings in which

FIG. 1 is a schematic drawing of a semiconductor switching circuit embodying the invention and FIGS. 2, 3, and 4 are waveshapes of various currents and voltages in the circuit of FIG. 1.

BEST MODE FOR CARRYING OUT THE INVENTION

Referring now to the circuit of FIG. 1, there is shown an NPN bipolar transistor Q1 having a collector electrode connected to a positive voltage through a resistor R and an inductor L which comprise an inductive load. A diode D is connected across the load to bypass current produced whenever current to the load is interrupted, as for example, by turn-off of the transistor Q1.

An emitter electrode of transistor Q1 is connected to a source electrode of a FET Q3, a drain electrode of which is connected to a terminal 12 having thereon a voltage which is lower than or negative with respect to the voltage on terminal 11. The difference of potential between terminals 11 and 12 is provided by a D-C source (not shown) having a positive and a negative pole. To control the switching action of bipolar transistor Q1, a base electrode thereof is connected to a drain electrode of a FET 22, a source electrode of which is connected to the end of the inductive load common to the collector electrode of transistor Q1.

A load current path for the load is completed by providing a FET Q3 having a source electrode connected to the emitter electrode of transistor Q1 and having a drain electrode connected to the terminal 12 with the lower electric potential. Thus, when the bipolar transistor Q1 and the FET Q3 are rendered conducting, current will flow from terminal 11 through inductor L, resistor R, the collector-emitter path of transistor Q1, and the source-drain path of FET Q3 to terminal 12.

Each of the FETs Q2 and Q3 includes a gate electrode which will cause the respective FET to conduct when its gate receives a positive voltage. Either of the FETs Q2 or Q3 will continue to conduct as long as the positive voltage is maintained on its gate.

To the end that FETs Q2 and Q3, together with the bipolar transistor Q1 will be rendered simultaneously conducting, the gate electrode of FET Q2 and the gate electrode of FET Q3 are both connected through respective leads 13 and 14 to a gate drive source 15. Gate drive source 15 provides positive rectangular pulses which are applied through the gate electrodes of FETs Q2 and Q3. The pulses are preferably rectangular but may be of other shapes such as portions of a sine wave. Accordingly, it will be seen that FETs Q2 and Q3 both conduct during the existence of the positive pulse. Consequently, Q1 which is driven by FET Q2 conducts in current flows through L and R. When the pulse terminates FETs Q2 and Q3, together with the bipolar transistor, Q1 will be rendered nonconducting to interrupt the load current.

At the end of each drive pulse, when FETs Q2 and Q3 are rendered nonconducting, the emitter electrode of transistor Q1 is put in an emitter open condition. This advantageously extends the voltage rating of the bipolar transistor because the collector-base breakdown voltage is typically greater than and may be as much as twice the collector-emitter sustaining voltage. Also, there is a reduction of storage time and fall time by a factor as great as two in most cases. However, there is now no path for the collector-base current which will continue to flow for a time ranging from a few hundred nanoseconds to a few microseconds, depending upon the type of bipolar transistor utilized. Also, the capacitance between the electrodes of FET Q2 must be discharged when the FET is rendered nonconducing.

To provide a path for collector-base current when transistor Q1 turns off and to discharge the capacitance of FET Q2 a zener diode voltage breakdown device Z is connected between the drain electrode of FET Q2 and the terminal 12 which is also connected to the drain electrode of FET Q3. The zener diode Z allows current to flow from terminal 12 to the drain electrode of transistor Q2 and, when the collector-base emitter voltage of transistor Q1 becomes sufficiently great, breaks down to allow the collector-base emitter current to flow to terminal 12.

Referring now to FIG. 2, there is shown a wave shape of the gate current supplied to the gate electrodes of FETs Q2 and Q3. A current pulse 16 occurs at T1 to render FETs Q2 and Q3 conducting while a current pulse 17 renders them nonconducting.

FIG. 3 is a wave shape illustrating the base current of transistor Q1 wherein a pulse of current flowing into the base renders Q1 conducting at time T1. Current pulse 19 represents the current flow from collector to base of transistor Q1 when it is rendered nonconducting at time T2. Current pulse 19 represents the current surge required to discharge the gate capacitance of FETs $Q_2$ and $Q_3$ when $Q_1$ turns on or off and is the only appreciable current to flow in the base circuit of $Q_1$. Line 20 indicates that the base current of transistor Q1 is advantageously proportional to current flow through that transistor.

In FIG. 4, there is shown a preferred rectangular pulse having a leading edge 21 at time T1 and a trailing edge 22 at time T2 with a flat top 23. This rectangular pulse is positive so that positive voltage is applied to the gate electrodes of FETs Q2 and Q3 between time T1 and T2 to maintain conduction. At time T2 the negative going trailing edge 22 of the rectangular pulse renders FETs Q2 and Q3 nonconducting.

It will be understood that at time T2 a negative voltage may be applied briefly to the gate electrodes of FETs Q2 and Q3 to insure their turnoff. Furthermore, the negative voltage may be maintained for a predetermined length of time to insure that random noise pulses do not affect the nonconducting state of FETs Q2 and Q3.

From the foregoing it will be seen that there is provided a hybrid switching circuit including a bipolar transistor and FETs which can be switched on and off much faster than a bipolar transistor alone. Additionally, the power electrodes of one of the transistors are in series with the power electrodes of the bipolar transistor to produce an emitter open condition on the bipolar transistor to take advantage of its high collector-base breakdown voltage. Furthermore, the gate drive circuitry for the FETs is very simple and is required to provide only a very low level of power to render the FETs and the bipolar transistor conducting. As an alternative to extending the operating range of transistor $Q_1$ its collector width can be reduced. This not only reduces turn-off time but reduces the size of the transistor chip allowing more transistors to fit on a wafer.

It will be understood that changes and modifications may be made to the above-described circuit without departing from the spirit and scope of the invention, as set forth in the claims appended hereto.

I claim:

1. A switching circuit for an inductive load energized from a d-c source, said switching circuit comprising:
   a bipolar transistor having first and second power electrodes and a control electrode;
   a first field effect transistor (FET) having first and second power electrodes and a gate electrode;
   means for connecting the power electrodes of the bipolar transistor and the first FET serially with the load cross the d-c source;
   a second FET having first and second power electrodes and a gate electrode, said first and second power electrodes being connected between the first power electrode and the control electrode of the bipolar transistor;
   gate drive means connected to the gate electrodes of both FETs and providing rectangular voltage pulses thereto, the FETs being in a conductive state during the existence of any positive rectangular pulse whereby load current passes through the load, the bipolar transistor and the first FET, the second FET applying a control signal to the control electrode of the bipolar transistor.

2. The switching circuit of claim 1 and including a voltage breakdown device connected between the control electrode of the bipolar transistor and the d-c source, the voltage breakdown device being poled to block current flow away from the control electrode of the bipolar transistor until a predetermined voltage is applied to the breakdown device.

3. The circuit of claim 2 wherein the voltage breakdown device is a zener diode.

4. The circuit of claim 1 and including in said gate drive means for applying a negative voltage to the gate electrodes of the FETs at the end of each rectangular pulse.

5. The circuit of claim 1 wherein the gate drive means provides rectangular pulses which are alternately positive and negative, the positive pulses corresponding to the time in which the load is supplied with current.

6. The circuit of claim 1 and including a diode connected across the load and poled to pass current away from the bipolar transistor.

7. A switching circuit for an inductive load energized from a d-c source and comprising:
   a bipolar transistor having collector base and emitter electrodes, the collector electrode connected to a first polarity of the d-c source by means of the inductive load;
   a first switch connected between the emitter electrode of the bipolar transistor and a second polarity of the d-c source;
   a second switch connected between the inductive load and the base electrode of the bipolar transistor;
   means for simultaneously closing or opening said first and second switches in accordance with current requirements of the load, the closing of the first switch providing a load current path from the emitter of the bipolar transistor to the second polarity of the d-c source, the closing of said second switch providing current to the base electrode of the bipolar transistor causing it to switch on, the opening of said switches establishing an emitter open condition on the bipolar transistor and elimination of its base current drive to render it non-conducting.

8. The circuit of claim 7 and including bypass means for passing current from the base electrode of the bipolar transistor to the second polarity of the d-c source when the collector-base voltage exceeds a predetermined value.

9. The circuit of claim 8 wherein the bypass means is a voltage breakdown means connected between the gate electrode of the bipolar transistor and the second polarity of the d-c source.

10. The circuit of claim 7 wherein said first switch is a FET having a source electrode connected to the emitter electrode of the bipolar transistor, a drain electrode connected to the second polarity of the d-c source and a gate electrode connected to the means for simultaneously opening or closing said first and second switches.

11. The circuit of claim 7 wherein said second switch is a FET having a source electrode connected to the load, a drain electrode connected to the base electrode of the bipolar transistor and a gate electrode connected to the means for simultaneously opening or closing said first and second switches.

* * * * *